United States Patent
O'Neill (10) Patent No.: US 10,953,470 B2
(45) Date of Patent: Mar. 23, 2021

(54) SCANNING MIRROR NAVIGATION APPARATUS AND METHOD

(71) Applicant: United Technologies Corporation, Farmington, CT (US)

(72) Inventor: Christopher F. O'Neill, Hebron, CT (US)

(73) Assignee: Raytheon Technologies Corporation, Waltham, MA (US)

( * ) Notice: Subject to any disclaimer, the term of this patent is extended or adjusted under 35 U.S.C. 154(b) by 966 days.

(21) Appl. No.: 15/253,217

(22) Filed: Aug. 31, 2016

(65) Prior Publication Data

US 2018/0056390 A1    Mar. 1, 2018

(51) Int. Cl.
*B22F 3/105* (2006.01)
*B22F 10/00* (2021.01)
(Continued)

(52) U.S. Cl.
CPC .......... *B22F 10/00* (2021.01); *B23K 26/0608* (2013.01); *B23K 26/082* (2015.10); *B23K 26/342* (2015.10); *B29C 64/124* (2017.08); *B29C 64/153* (2017.08); *B29C 64/236* (2017.08); *B29C 64/268* (2017.08); *B29C 64/393* (2017.08); *B33Y 10/00* (2014.12); *B33Y 30/00* (2014.12); *G02B 26/101* (2013.01);
(Continued)

(58) Field of Classification Search
CPC ...... B22F 2003/1057; B22F 2003/1056; B22F 2203/03; B22F 3/1055; B23K 26/0608; B23K 26/082; B23K 26/342; B23K 15/086; B29C 64/124; B29C 64/153; B29C 64/236; B29C 64/268; B29C 64/393; B33Y 10/00; B33Y 30/00; B33Y 50/02; G02B 26/101
See application file for complete search history.

(56) References Cited

U.S. PATENT DOCUMENTS 4,660,981 A * 4/1987 Stridsberg .............. G01B 11/00
356/615
5,495,328 A * 2/1996 Spence ................. G01J 1/4257
356/121
(Continued)

FOREIGN PATENT DOCUMENTS

EP    2832475 A2    2/2015
GB    2405369 A     3/2005
(Continued)

OTHER PUBLICATIONS

Owen, R. B., et al., "Laser Beam Manifold and Particle Photography System for Use in Fluid Velocity Measurements", Abstract Only, Dated Nov. 1, 1980, <http://ntrs.nasa.gov/search.jsp?R=19810032233>, 1 page.
(Continued)

*Primary Examiner* — Anthony J Zimmer
*Assistant Examiner* — Nicholas A Wang
(74) *Attorney, Agent, or Firm* — Kinney & Lange, P.A.

(57) ABSTRACT

An additive manufacturing machine includes an energy unit with two energy beam sources, each with a different power level of energy beam. In addition, a build unit receives the energy beams, and a reflecting unit is positioned between the energy unit and the build unit and directs the energy beams. There is also an energy beam detector positioned on or near the build unit.

17 Claims, 5 Drawing Sheets

(51) Int. Cl.

| | |
|---|---|
| *B29C 64/124* | (2017.01) |
| *G02B 26/10* | (2006.01) |
| *B23K 26/082* | (2014.01) |
| *B29C 64/153* | (2017.01) |
| *B23K 26/342* | (2014.01) |
| *B29C 64/268* | (2017.01) |
| *B29C 64/393* | (2017.01) |
| *B29C 64/236* | (2017.01) |
| *B23K 26/06* | (2014.01) |
| *B33Y 10/00* | (2015.01) |
| *B33Y 30/00* | (2015.01) |
| *B22F 10/10* | (2021.01) |
| *B33Y 50/02* | (2015.01) |
| *H01J 37/30* | (2006.01) |

(52) U.S. Cl.
CPC ........... *B22F 10/10* (2021.01); *B22F 2998/10* (2013.01); *B22F 2999/00* (2013.01); *B33Y 50/02* (2014.12); *H01J 37/30* (2013.01); *Y02P 10/25* (2015.11)

(56) References Cited

U.S. PATENT DOCUMENTS

| | | | | |
|---|---|---|---|---|
| 5,508,489 | A | * | 4/1996 | Benda ................... B22F 3/1055 219/121.76 |
| 2003/0052105 | A1 | * | 3/2003 | Nagano .............. B23K 26/0604 219/121.83 |
| 2014/0052288 | A1 | * | 2/2014 | El-Siblani ............ G05B 19/042 700/119 |
| 2015/0298166 | A1 | | 10/2015 | Poullos |
| 2015/0375456 | A1 | | 12/2015 | Cheverton et al. |

FOREIGN PATENT DOCUMENTS

| | | | |
|---|---|---|---|
| JP | 2000313067 | * | 11/2000 |
| WO | WO2015/091459 A1 | | 6/2015 |

OTHER PUBLICATIONS

Extended European Search Report, for European Patent Application No. 17188846.4, dated Feb. 16, 2018, 8 pages.

European Office Action dated Oct. 9, 2019, received for corresponding European Patent Application No. 17188846.4, 4 pages.

* cited by examiner

SCANNING MIRROR NAVIGATION APPARATUS AND METHOD

BACKGROUND

The present invention relates generally to additive manufacturing machines, and more particularly to an energy beam system for an additive manufacturing machine.

There are several known types of additive manufacturing machines. Some of them employ an energy beam to heat up pulverulent material contained in a build unit in order to fuse or sinter the material together. This sintering occurs selectively such that there are specific areas of pulverulent in the build unit that are sintered and other areas that remain loose. Oftentimes the energy beam is a laser beam originating from a stationary laser, and the build unit is oftentimes stationary as well. In such a machine, the laser beam is moved about the build unit by machine-positioned mirrors that reflect the beam as desired. Like any machine, additive manufacturing machines can develop random or systematic errors in the positioning of the mirrors and/or the emission of the laser, which can cause the location of the sintering to drift with respect to the intended sintering location. Calibration of an additive manufacturing machine traditionally takes a significant amount of time, during which the machine cannot be producing objects. Therefore calibration is only done infrequently, generally about once every six months, and no further measurement of the accuracy of the laser beam occurs in between calibrations.

SUMMARY

In one aspect, an additive manufacturing machine includes an energy unit with two energy beam sources, each with a different power level of energy beam. In addition, a build unit receives the energy beams, and a reflecting unit is positioned between the energy unit and the build unit and directs the energy beams. There is also an energy beam detector positioned on or near the build unit.

In another aspect, a method of operating an additive manufacturing machine includes calibrating a reflecting unit to create a grid that correlates reflector positions with positions on a build unit and a location of an energy beam detector. The method further includes sintering a first layer of material using a high-power energy beam that travels along a common path to form a sintered layer of an object, and targeting the energy beam detector using a low-power energy beam that travels along the common path to measure a reflector position. The reflector position is compared with the grid, and a correction factor is determined as a function of this comparison. A correction factor is applied to the grid, and another layer of material is sintered using the high-power energy beam according to the corrected grid.

The present summary is provided only by way of example, and not limitation. Other aspects of the present disclosure will be appreciated in view of the entirety of the present disclosure, including the entire text, claims and accompanying figures.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

Figure 1:
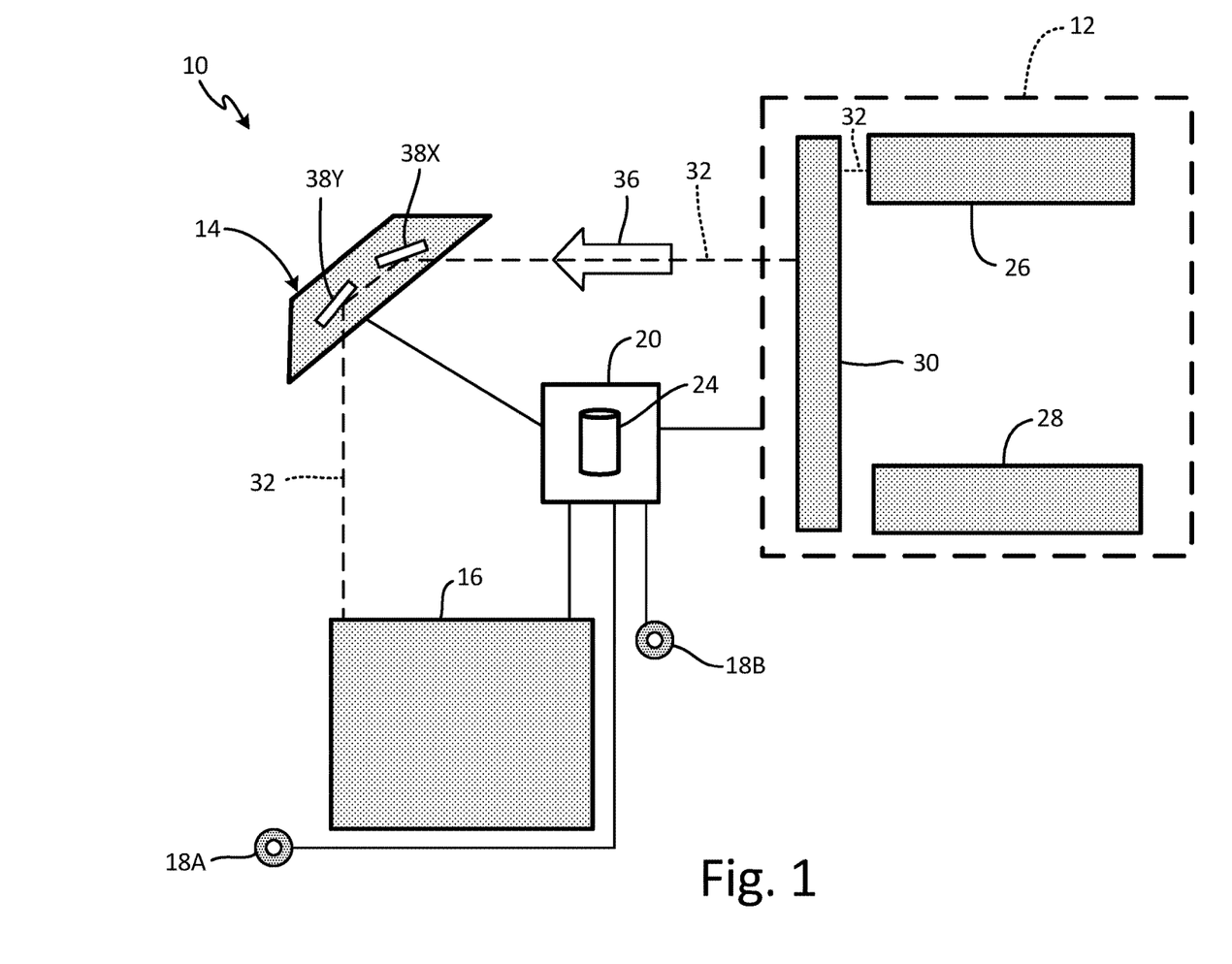
FIG. 1 is a schematic view of an embodiment of an additive manufacturing machine performing a manufacturing step.

FIG. 1 is a schematic view of additive manufacturing machine 10 performing a manufacturing step. In the illustrated embodiment, additive manufacturing machine 10 includes energy unit 12, reflecting unit 14, build unit 16, detectors 18A and 18B, and control unit 20. In general, energy unit 12 creates an energy beam that is directed onto specific areas of build unit 16 by reflecting unit 14. Build unit 16 includes a powder bed with pulverulent material (not shown), selected areas of which are sintered by the energy beam to form an object (not shown). The energy beam penetrates the powder bed by a predetermined distance, and the object is built up layer-by-layer by sintering new pulverulent material on top of the previously sintered layers in a specified pattern. Additive manufacturing machine 10 is controlled by control unit 20, which includes memory unit 24.

Figure 2:
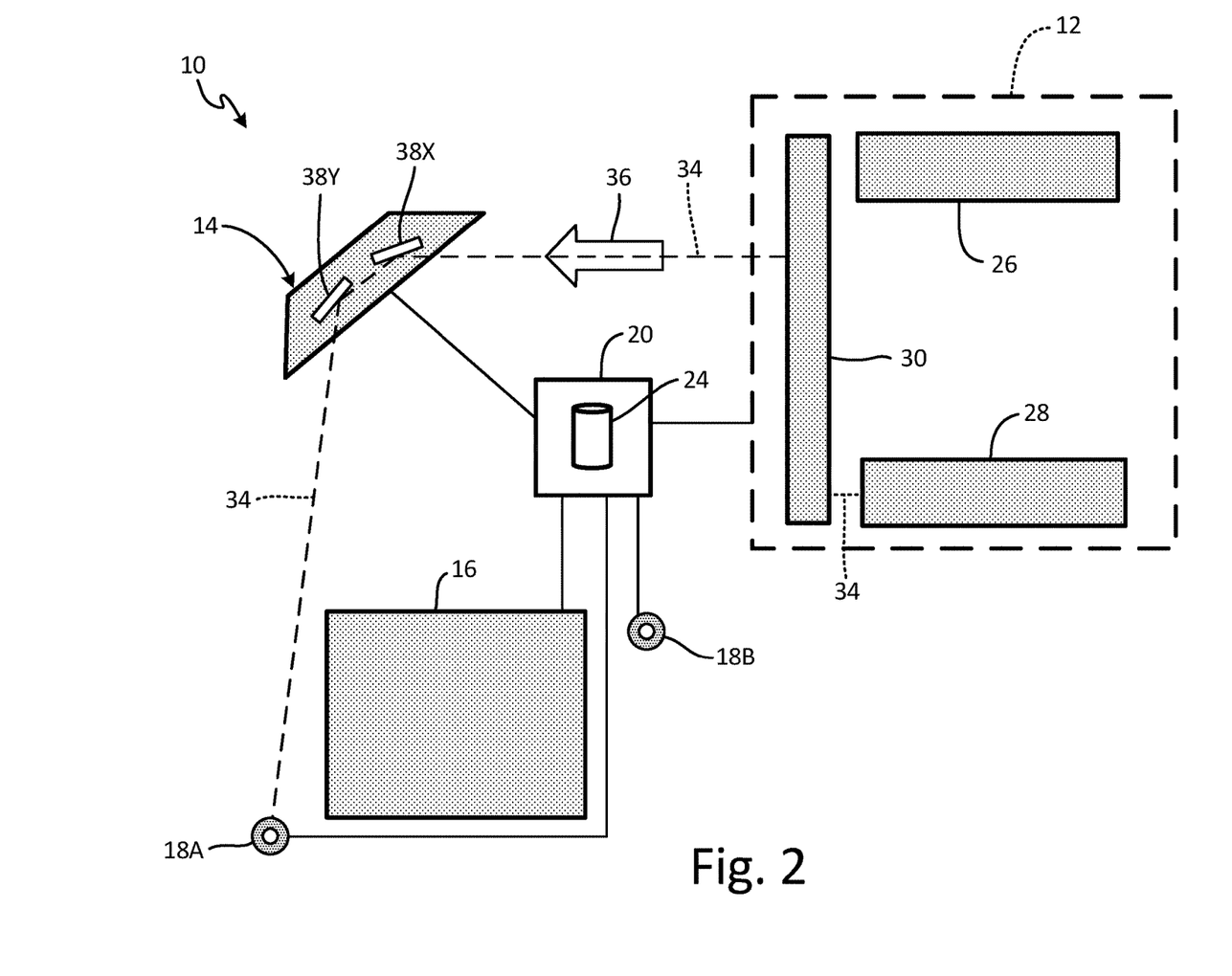
FIG. 2 is a schematic view of the additive manufacturing machine of FIG. 1 performing a targeting step.

More specifically, in the illustrated embodiment energy unit 12 includes high-power laser 26, low-power laser 28, and laser manifold 30. Laser manifold 30 is configured and positioned to receive high beam 32 from high-power laser 26 (as shown in FIG. 1) and/or low beam 34 from low-power laser 28 (as shown in FIG. 2). Laser manifold 30 emits high beam 32 and/or low beam 34 along a single common beam path 36. This can be accomplished, for example, by having lasers 26 and 28 emit beams 32 and 34, respectively, into a fiber optic array (not shown) that emits one or both beams 32 and 34 along common beam path 36. In some embodiments, beams 32 and 34 emitted from laser manifold 30 are or would be coincident with each other, and in other embodiments, beams 32 and 34 are emitted parallel to each other but are so close that the distance between them is insignificant. In general, any error that may be introduced into additive manufacturing machine 10 by laser manifold 30 would be insignificant and would not substantially affect the build quality of the object.

Reflecting unit 14 is positioned in line with common beam path 36, which includes mirror 38X and mirror 38Y which are optically in series with one another. Each of mirrors 38X and 38Y is connected to a motor (not shown) which pivots the mirror about the Y axis and the X axis, respectively. In this manner, reflecting unit 14 directs high beam 32 to build unit 16 and is able to move high beam 32 in the X and Y directions of a Cartesian coordinate system using mirrors 38X and 38Y, respectively. Control unit 20 controls high-power laser 26 and mirrors 38X and 38Y to selectively sinter pulverulent material to form the layers that make up the object.

A rendering of the object is typically stored in memory unit 24 of control unit 20. In order to translate the rendering into the object, control unit 20 breaks the rendering down to slices and determines the locations on build unit 16 where high beam 32 must travel in order to form each slice. In the illustrated embodiment, energy unit 12 and build unit 16 are stationary, so control unit 20 is calibrated using high beam 32 to correlate which positions of mirrors 38X and 38Y correspond which positions on build unit 16. Specifically, memory unit 24 includes a grid or table that includes a plurality of data sets that correlate the mirror positions to the build unit positions. This allows control unit 20 to change the positions of mirrors 38X and 38Y to guide high beam 32 along build unit 16 to sinter the appropriate areas in order to form each layer of the object.

FIG. 2 is a schematic view of additive manufacturing machine 10 performing a targeting step. As stated previously, energy unit 12 also includes low-power laser 28. Low-power laser 28 can emit low beam 34 which is collected by laser manifold 30 and sent along common beam path 36. While low beam 34 could be directed at build unit 16, low beam 34 is not powerful enough to properly sinter the pulverulent material. Instead, low beam 34 is directed at detectors 18A and 18B, in turn, by reflecting unit 14. Detectors 18A and 18B can be positioned adjacent to the distal or opposite corners of build unit 16 and are fixed with respect to build unit 16. Detectors 18A and 18B are communicably connected to control unit 20 and are sensitive to low beam 34 in a manner that allows control unit 20 to determine when low beam 34 is aimed directly at one of detectors 18A and 18B. This sensitivity means that pointing high beam 32 (shown in FIG. 1) at detectors 18A and 18B can damage detectors 18A and 18B.

Additive manufacturing machine 10 initially targets detectors 18A and 18B with low beam 34 during the calibration process. Thereby, the grid (from memory unit 24) further includes two data sets, each data set correlating the positions of mirrors 38X and 38Y with the location of one of detectors 18A and 18B. These two data sets can be simply added to the grid because both beams 32 and 34 travel along common beam path 36 from laser manifold 30 to reflecting unit 14. Causing additive manufacturing machine 10 to target detectors 18A and 18B, unlike performing the entire calibration process, does not take a significant amount of time. Therefore, targeting detectors 18A and 18B can occur during the building of a single object, for example, after every other or every third layer is sintered, or at any other desired frequency.

Each time detectors 18A and 18B are targeted, the positions of mirrors 38X and 38Y can be compared to the data sets in the grid that corresponds to detectors 18A and 18B. If the previous positions of mirrors 38X and 38Y contained in the grid are the same as the current target data, then additive manufacturing machine 10 can continue sintering the object using high beam 32 (shown in FIG. 1) according to the data sets in the existing grid. However, due to random errors in the positioning of mirrors 38X and/or 38Y and/or long-term changes in the optical equipment in energy unit 12 and/or reflecting unit 14, the detector targeting step may reveal that the current positions of mirrors 38X and/or 38Y that correspond to the locations of detectors 18A and/or 18B are different than they previously were. Such a result indicates that when control unit 20 uses the grid to position mirrors 38X and 38Y in order to direct high beam 32 to a particular position on build unit 16, high beam 32 actually intersects with build unit 16 at a different position. This can lead to layers in the object being offset from other layers, and, in turn, can degrade a build quality of the object.

Therefore, control unit 20 calculates and stores a correction factor or factors that represent the difference between the initial positions of mirrors 38X and 38Y that corresponded to the locations of detectors 18A and 18B and the subsequent positions of mirrors 38X and 38Y that correspond to the locations of detectors 18A and 18B. The correction factor or factors are then applied to each data set in the grid and the most recent mirror positions corresponding to detectors 18A and 18B replace the initial detector data sets to form a new grid. This action effectively aligns the new grid with the original calibration grid. This feedback process can occur multiple times throughout the build of the object to ensure consistency of the frame of reference with which high beam 32 is guided (as shown in FIG. 1).

Shown in FIGS. 1 and 2 are one embodiment of the present disclosure, to which there are alternative embodiments. For example, energy unit can fire electrons from electron guns at different energy levels. In such an embodiment, reflecting unit 14 would include devices that are configured to reflect electrons. For another example, reflecting unit 14 can contain only a single mirror that is mounted on a multi-axis positioning system. For a further example, detectors 18A and/or 18B can be positioned anywhere on or near build unit 16.

Figure 3:
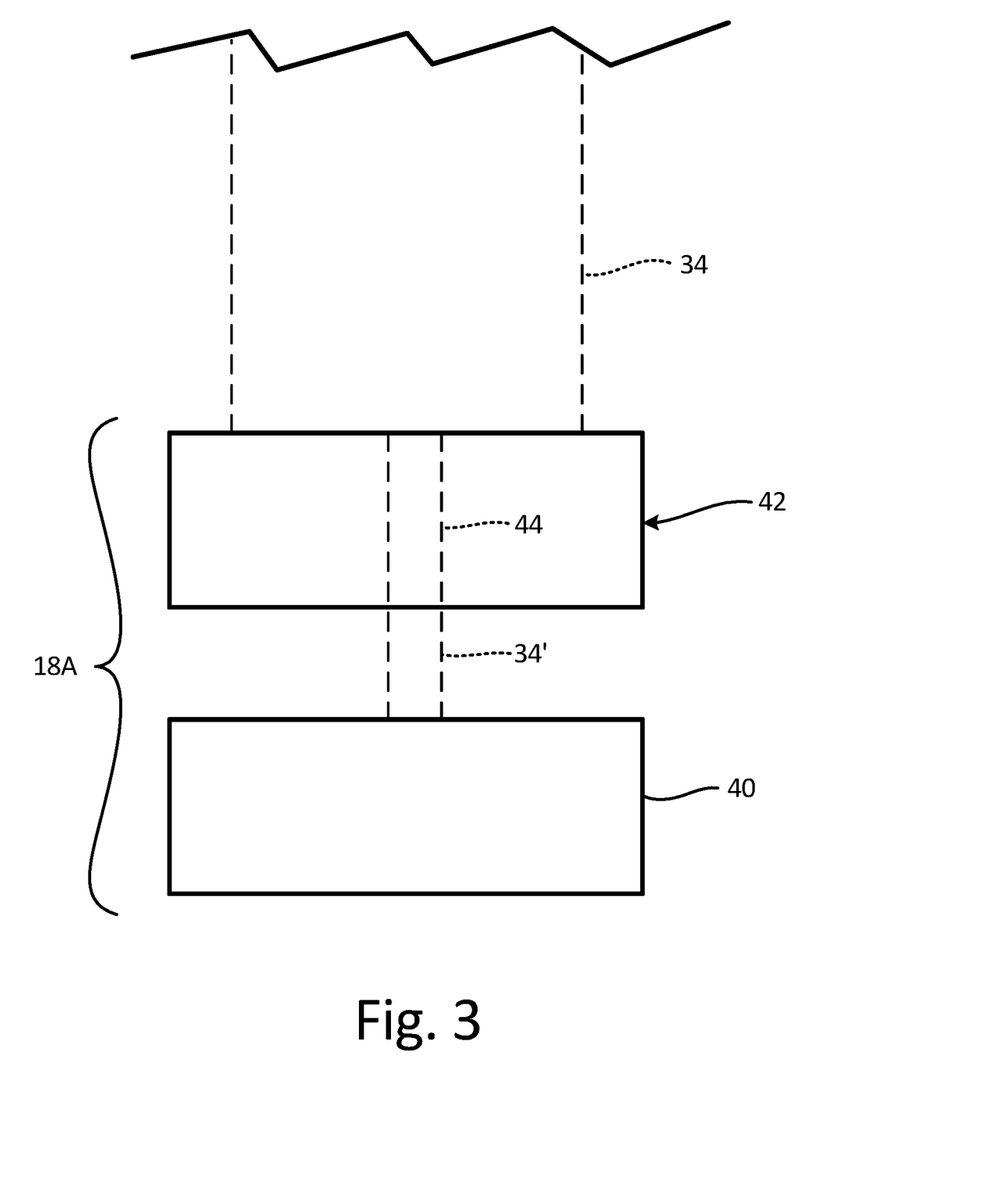
FIG. 3 is a schematic view of a detector.

FIG. 3 is a schematic view of detector 18A. In the illustrated embodiment, detector 18A includes photo cell 40 and aperture plate 42. Aperture plate 42 is positioned between reflecting unit 14 (shown in FIG. 1) and photo cell 40. Aperture plate 42 includes aperture 44 which is a circular hole through aperture plate 42 that has a diameter that is approximately one tenth as wide as a width or diameter of low beam 34. This means that only a portion of low beam 34 reaches photo cell 40 even when low beam 34 is oriented directly at photo cell 40. This portion of low beam 34 is denoted as low beam 34' in FIG. 3. A local power within low beam 34 varies according to a Gaussian Curve, with the highest amount of power being concentrated near the center of low beam 34. Photo cell 40 reacts to low beam 34 passing through aperture plate 42 by sending a voltage to control unit 20 (shown in FIG. 1). The voltage level is proportionate to the power of low beam 34, so the signal sent to control unit 20 will be the stronger the closer low beam 34 is to pointing directly at aperture 44.

The process for targeting detector 18A can be as follows. Mirrors 38X and 38Y are positioned according to the grid in order to direct low beam 34 at the location of detector 18A. Then, mirror 38X is turned back and forth to move low beam 34 with respect to detector 18A. Control unit 20 measures the strength of the signal from detector 18A, and orients mirror 38X to the position where the signal was the strongest. Then, mirror 38Y is turned back and forth to move low beam 34 with respect to detector 18A. Control unit 20 measures the strength of the signal from detector 18A, and orients mirror 38Y to the position where the signal was the strongest. The positions of mirrors 38X and 38Y are then compared to the positions listed in the grid. A correction factor or factors are then calculated, if necessary, as a function of that comparison.

The components and configuration of detector 18A allow for the detection of small changes in the orientation of mirrors 38X and 38Y. Detector 18B can also be the same or similar to detector 18A. In alternative embodiments, photo cell 42 may be a different type of sensor depending on the energy level and/or energy type of low beam 34.

Figure 4:
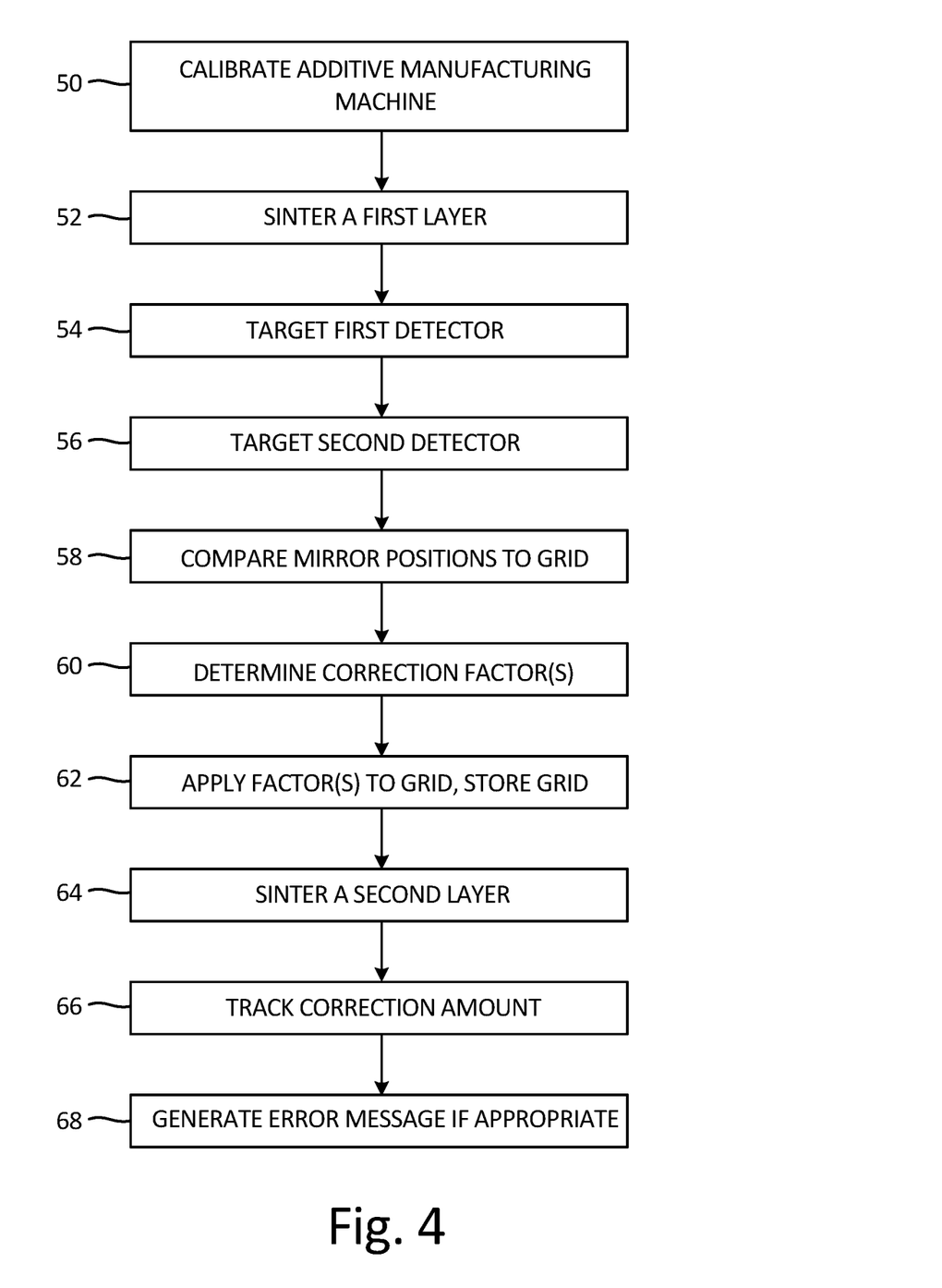
FIG. 4 is a flow chart of an embodiment of the method of operating the additive manufacturing machine of FIG. 1.

FIG. 4 is a flow chart of a method of operating additive manufacturing machine 10. At step 50, additive manufacturing machine 10 is calibrated and the grid is stored in memory unit 24. At step 52, additive manufacturing machine 10 sinters a first layer of an object using high beam 32. At step 54, detector 18A is targeted using low beam 34, and at step 56, detector 18B is targeted using low beam 34. At step 58, control unit 20 compares the mirror positions in the grid to the mirror positions found during steps 54 and 56. Control unit 20 then determines a correction factor or set of factors at step 60, and the factor or set of factors is applied to the grid values to create a second grid, which is stored in memory unit 24 at step 62. Alternatively, the original grid could be kept and rewritten including the correction factor or set of factors each time steps 54-60 are performed. In such an embodiment, it can be beneficial to store each correction factor or set of factors in memory unit 24. At step 64, a second layer of the object is sintered using high beam 32 that is directed by control unit 20 according to the second (corrected) grid.

Before discussing the remaining steps 66 and 68 that are included in FIG. 4, it is helpful to discuss three possible types of correction factors used to provide feedback in additive manufacturing machine 10. The first type is a translation correction factor. A translation correction factor is needed if the error in mirrors 38X and 38Y effectively shifts the grid in the X and/or Y directions of a Cartesian coordinate system with respect to build unit 16. In this scenario, a displacement value for the amount of shift in the X direction and/or a displacement value for the amount of shift in the Y direction is applied to all of the data sets in the grid in order shift the grid back to the initial calibration state, which recorrelates the reflector positions with the positions on build unit 16.

The second type is a set of rotation correction factors. A set of rotation correction factors is needed if the error in mirrors 38X and 38Y effectively rotates the grid about an axis in the Z direction of a Cartesian coordinate system with respect to build unit 16. In this scenario, a plurality of displacement values is generated with each displacement value being assigned to a specific data set in the grid. The displacement values are determined, at least in part, according to the distance from the rotational axis and the direction of rotation. When the plurality of displacement values are applied to all of the data sets in the grid, the grid is rotated back to the initial calibration state, which recorrelates the reflector positions with the positions on build unit 16.

The third type is a set of scaling correction factors. A set of scaling correction factors is needed if the error in mirrors 38X and 38Y and/or changes in the optical components effectively stretches the grid and/or rotates the grid about an axis in the X and/or Y directions of a Cartesian coordinate system with respect to build unit 16. In this scenario, a plurality of displacement values is generated with each displacement value being assigned to a specific data set in the grid. When the plurality of displacement values are applied to all of the data sets in the grid, the grid is rotated back to the initial calibration state, which recorrelates the reflector positions with the positions on build unit 16.

In addition, there may be situations which require multiple of the three kinds of correction factors to be applied to the grid. While grid corrections can be the result of random error(s) in the positioning of mirrors 38X and/or 38Y, the grid corrections can reflect changes in additive manufacturing machine 10 that can require repair or replacement of components of the system. Therefore, at step 66, an amount of correction (including scaling) that the grid has undergone is tracked and recorded on memory unit 24. At step 68, an error message is generated if the amount of correction exceeds a preset threshold. Steps 66 and 68 are especially helpful if the errors in additive manufacturing machine 10 are trending in a particular direction without significant reversal or stabilization. In addition, from this point, steps 52-68 can be repeated until the object is completed, after which the object will be removed, and steps 52-68 repeated as necessary to fabricate another object. This cycle can continue until step 50 is performed once again.

Figure 5:
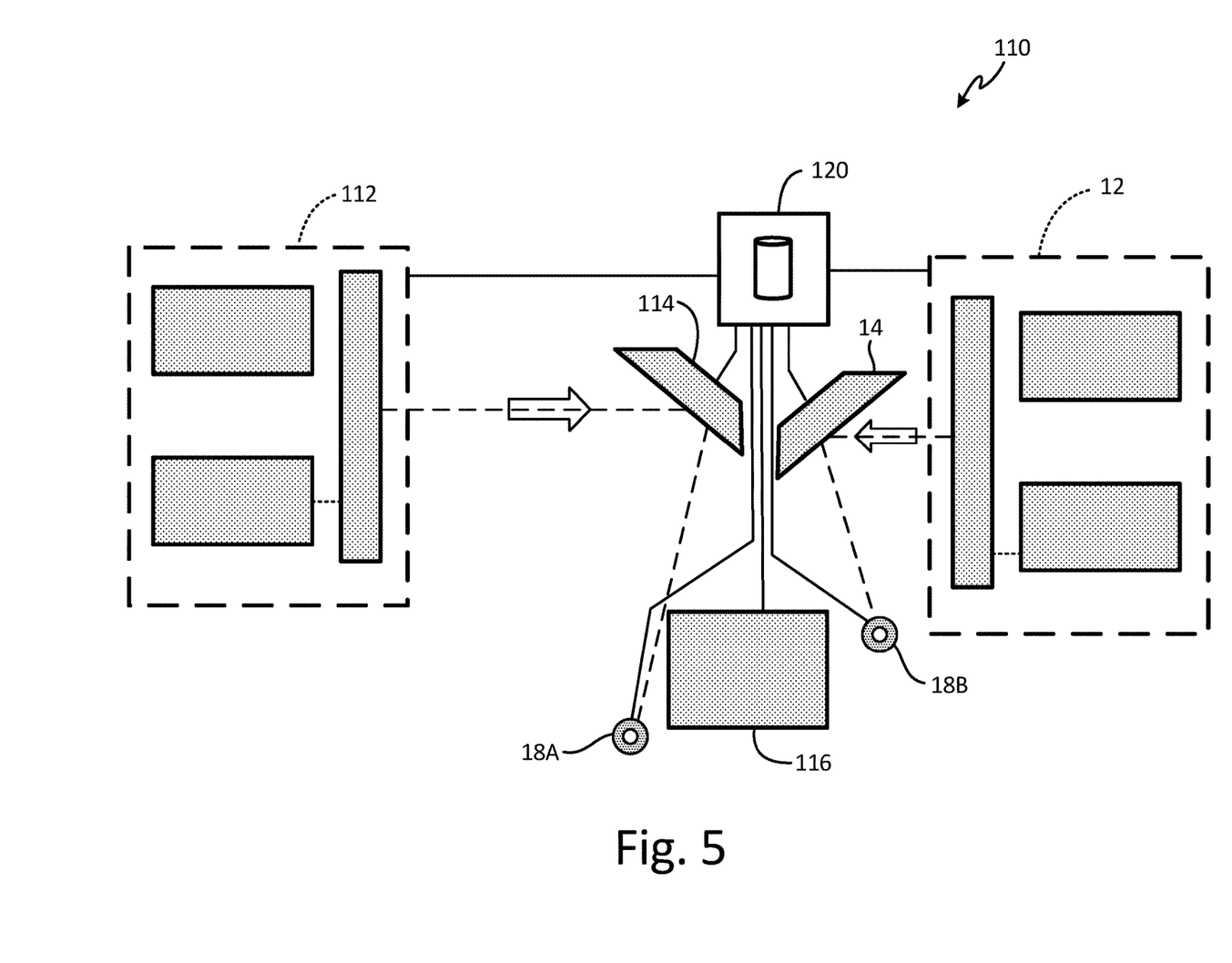
FIG. 5 is an alternate embodiment of the additive manufacturing machine.

FIG. 5 is an alternate embodiment additive manufacturing machine 110. In the illustrated embodiment, additive manufacturing machine 110 includes energy unit 12, reflecting unit 14, and detectors 18A and 18B. Additive manufacturing machine 110 further includes energy unit 112, reflecting unit 114, build unit 116, and control unit 120. The reference characters in FIG. 5 are increased by one hundred for similar structures as those the embodiment of FIGS. 1 and 2. Such an arrangement allows for additive manufacturing machine 110 to make multiple objects simultaneously, or allows for a layer of a single object to be sintered by both energy units 12 and 112 simultaneously. Furthermore, each energy unit 12 and 112 is able to target both detectors 18A and 18B so that control unit 120 can provide correction feedback for both energy units 12 and 112. Moreover, energy units 12 and 112 can target detectors 18A and 18B at separate times, for example, when the other energy unit is sintering the object. In general, additive manufacturing machine 110 increases the number of objects that can be made in a given amount of time.

Discussion of Possible Embodiments

The following are non-exclusive descriptions of possible embodiments of the present invention.

An additive manufacturing machine according to an exemplary embodiment of this disclosure, among other possible things includes: an energy unit comprising: a first energy beam source that outputs a first energy beam with a first power level; and a second energy beam source that outputs a first energy beam with a second power level that is lower than the first power level; a build unit that receives at least one of the first energy beam and the second energy beam to build an object; a reflecting unit positioned between the energy unit and the build unit that directs the at least one of the first energy beam and the second energy beam; and a first energy beam detector positioned on or adjacent to the build unit.

The additive manufacturing machine of the preceding paragraph can optionally include, additionally and/or alternatively, any one or more of the following features, configurations and/or additional components:

A further embodiment of the foregoing additive manufacturing machine, wherein the additive manufacturing machine can further comprise: a second energy beam detector positioned on or adjacent to the build unit, opposite of the first energy beam detector.

A further embodiment of any of the foregoing additive manufacturing machines, wherein the energy unit can further comprise: an energy manifold that receives the at least one of the first energy beam and the second energy beam, and emits the at least one of the first energy beam and the second energy beam along a common beam path to the reflecting unit.

A further embodiment of any of the foregoing additive manufacturing machines, wherein the reflecting unit can comprise a first mirror and a second mirror in series, wherein the first mirror can be rotatable about a first axis and wherein the second mirror can be rotatable about a second axis that is orthogonal to the first axis.

A further embodiment of any of the foregoing additive manufacturing machines, wherein the additive manufacturing machine can further comprise: a control unit for controlling movement of the reflecting unit, wherein the control unit includes a memory unit in which a first grid is stored, the first grid comprising a plurality of data sets that correlate a plurality of reflector positions with a plurality of positions on a build unit and a first location of the first energy beam detector.

A further embodiment of any of the foregoing additive manufacturing machines, wherein the memory unit can be configured to store a correction factor representing a difference between a first reflector position corresponding to the first location of the first energy beam detector and a second reflector position corresponding to a second location of the first energy beam detector.

A further embodiment of any of the foregoing additive manufacturing machines, wherein the memory unit can be configured to store a second grid representing the first grid with the correction factor applied to the data sets.

A further embodiment of any of the foregoing additive manufacturing machines, wherein the correction factor can be a scaling factor.

An energy beam apparatus according to an exemplary embodiment of this disclosure, among other possible things includes: an energy unit comprising: a first energy beam source that outputs a first energy beam with a first power level; a second energy beam source that outputs a first energy beam with a second power level that is lower than the first power level; and an energy manifold that receives at least one of the first energy beam and the second energy beam, and emits the at least one of the first energy beam and the second energy beam along a common beam path; a reflecting unit positioned in line with the common beam path, the reflecting unit being controllable to direct the at least one of the first energy beam and the second energy beam; a first energy beam detector positioned to receive the second energy beam from the reflecting unit; and a second energy beam detector positioned distal from the first energy beam detector to receive the second energy beam from the reflecting unit.

A method of operating an additive manufacturing machine according to an exemplary embodiment of this disclosure, among other possible things includes: calibrating a reflecting unit to create a grid, the grid comprising a plurality of data sets that correlate a plurality of reflector positions with a plurality of positions on a build unit and a first location of a first energy beam detector; sintering a first layer of material using a high-power energy beam that travels, at least in part, along a common path to form a first sintered layer of an object; targeting the first energy beam detector using a low-power energy beam that travels, at least in part, along the common path and measuring a first reflector position; comparing the first reflector position with the grid; determining a correction factor as a function of the comparison between first reflector position and the grid; applying the correction factor to the plurality of data sets in the grid; sintering a second layer of material using the high-power energy beam according to the corrected grid to form a second sintered layer of the object.

The method of the preceding paragraph can optionally include, additionally and/or alternatively, any one or more of the following features, configurations and/or additional components:

A further embodiment of the foregoing method, wherein the plurality of data sets can also correlate the plurality of reflector positions with a second location of a second energy beam detector, wherein the method can further comprise: targeting the second energy beam detector using a low-power energy beam and measuring a second reflector position.

A further embodiment of any of the foregoing methods, wherein targeting the second energy beam detector can occur between targeting the first energy beam detector and comparing the first reflector position with the grid.

A further embodiment of any of the foregoing methods, wherein comparing the first reflector position with the grid can further comprise comparing the second reflector position with the grid to determine the correction factor.

A further embodiment of any of the foregoing methods, wherein applying the correction factor to the grid can comprise adding the correction factor to each of the plurality of reflector positions in the grid.

A further embodiment of any of the foregoing methods, wherein applying the correction factor can effectively translate the grid in order to recorrelate the plurality of reflector positions with the plurality of positions on the build unit and the first location of a first energy beam detector.

A further embodiment of any of the foregoing methods, wherein the plurality of data sets can also correlate the plurality of reflector positions with a second location of a second energy beam detector, wherein: the method can further comprise targeting the second energy beam detector using a low-power energy beam and measuring a second reflector position; and applying the correction factor to the grid comprises generating a plurality of displacement values and adding each of the plurality of displacement values to a corresponding one of the plurality of reflector positions in the grid.

A further embodiment of any of the foregoing methods, wherein applying the correction factor can effectively translates the grid in order to recorrelate the plurality of reflector positions with the plurality of positions on the build unit, the first location of the first energy beam detector, and the second location of the second energy beam detector.

A further embodiment of any of the foregoing methods, wherein applying the correction factor can effectively rotates the grid in order to recorrelate the plurality of reflector positions with the plurality of positions on the build unit, the first location of the first energy beam detector, and the second location of the second energy beam detector.

A further embodiment of any of the foregoing methods, wherein applying the correction factor can effectively scales the grid in order to recorrelate the plurality of reflector positions with the plurality of positions on the build unit, the first location of the first energy beam detector, and the second location of the second energy beam detector.

A further embodiment of any of the foregoing methods, wherein the method can further comprise: tracking an amount of scaling that the grid has undergone; and generating an error message if the amount of scaling exceeds a preset threshold.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, alignment or shape variations induced by thermal, rotational or vibrational operational conditions, and the like.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An additive manufacturing machine comprising:
    an energy unit comprising:
        a first energy beam source that emits a first energy beam with a first power level, wherein the first power level would damage a first energy beam detector and a second energy beam detector if the first energy beam is pointed at the first energy beam detector and the second energy beam detector; and
        a second energy beam source that emits a second energy beam with a second power level that is lower than the first power level, wherein the first energy beam detector and the second energy beam detector are sensitive to the second power level;
    a build unit that receives the first energy beam to build an object, the build unit defining a first build unit corner and a second build unit corner, one distal the other;
    an energy manifold that receives at least one of the first energy beam and the second energy beam, and emits at least one of the first energy beam and the second energy beam along a common beam path to a reflecting unit, wherein the energy manifold is configured to emit the first energy beam during a build cycle and to emit the second energy beam during a calibration cycle;
    the reflecting unit positioned between the energy unit and the build unit, wherein the reflecting unit is configured to direct the first energy beam to the build unit when the energy manifold emits the first energy beam and to direct the second energy beam to at least one of the first energy beam detector and the second energy beam detector when the energy manifold emits the second energy beam;
    the first energy beam detector proximate the build unit, proximate the first build unit corner; and
    the second energy beam detector proximate the build unit, proximate the second build unit corner;
    wherein:
        the additive manufacturing machine is configured to determine a correction factor using the second energy beam and the first and second energy beam detectors; and
        the second energy beam is configured to target the first energy beam detector and the second energy beam detector to determine a difference between a first reflector position corresponding to the first location of the first energy beam detector and a second reflector position corresponding to a second location of the first energy beam detector.

2. The additive manufacturing machine of claim 1, wherein the reflecting unit comprises a first mirror and a second mirror in series, wherein the first mirror is rotatable about a first axis and wherein the second mirror is rotatable about a second axis that is orthogonal to the first axis.

3. The additive manufacturing machine of claim 1, further comprising:
    a control unit for controlling movement of the reflecting unit, wherein the control unit includes a memory unit in which a first grid is stored, the first grid comprising a plurality of data sets that correlate a plurality of reflector positions with a plurality of positions on a build unit and a first location of the first energy beam detector.

4. The additive manufacturing machine of claim 3, wherein the memory unit is configured to store a correction factor representing the difference between a first reflector position corresponding to the first location of the first energy beam detector and a second reflector position corresponding to a second location of the first energy beam detector.

5. The additive manufacturing machine of claim 4, wherein the memory unit is configured to store a second grid representing the first grid with the correction factor applied to the data sets.

6. The additive manufacturing machine of claim 4, wherein the correction factor is a scaling factor.

7. An energy beam apparatus comprising:
    an energy unit comprising:
        a first energy beam source that emits a first energy beam with a first power level, wherein the first power level would damage a first energy beam detector and a second energy beam detector if the first energy beam is pointed at the first energy beam detector and the second energy beam detector; and
        a second energy beam source that emits a second energy beam with a second power level that is lower than the first power level, wherein the first energy beam detector and the second energy beam detector are sensitive to the second power level;
    a build unit that receives the first energy beam to build an object, the build unit defining a first build unit corner and a second build unit corner, one distal the other;
    an energy manifold that receives the at least one of the first energy beam and the second energy beam, and emits the at least one of the first energy beam and the second energy beam along a common beam path to the reflecting unit wherein the energy manifold is configured to emit the first energy beam during a build cycle and to emit the second energy beam during a calibration cycle;
    a reflecting unit positioned between the energy unit and the build unit, wherein the reflecting unit is configured to direct the first energy beam to the build unit when the energy manifold emits the first energy beam and to direct the second energy beam to at least one of the first energy beam detector and the second energy beam detector when the energy manifold emits the second energy beam;
    the first energy beam detector positioned to receive the first energy beam from the reflecting unit; and
    the second energy beam detector positioned to receive the second energy beam from the reflecting unit;
    wherein:
        the first energy beam detector is disposed proximate the build unit, proximate the first build unit corner;
        the second energy beam detector is disposed proximate the build unit, proximate the second build unit corner; and
        the second energy beam is configured to target the first energy beam detector and the second energy beam detector to determine a difference between a first reflector position corresponding to the first location of the first energy beam detector and a second reflector position corresponding to a second location of the first energy beam detector.

8. A method of operating an additive manufacturing machine comprising an energy unit that comprises a first energy beam source that emits a first energy beam with a first power level, wherein the first power level would damage a first energy beam detector and a second energy beam detector if the first energy beam is pointed at the first energy beam detector and the second energy beam detector, and a second energy beam source that emits a second energy beam with a second power level that is lower than the first power level, wherein the first energy beam detector and the second energy beam detector are sensitive to the second power level, a build unit that receives the first energy beam to build an object, the build unit defining a first build unit corner and a second build unit corner, one distal the other, an energy manifold that receives at least one of the first energy beam and the second energy beam, and emits at least one of the first energy beam and the second energy beam along a common beam path to the reflecting unit, a reflecting unit positioned between the energy unit and the build unit, wherein the reflecting unit is configured to direct the first energy beam to the build unit when the energy manifold emits the first energy beam and to direct the second energy beam to at least one of the first energy beam detector and the second energy beam detector when the energy manifold emits the second energy beam, the first energy beam detector positioned on or proximate the build unit, proximate the first build unit corner, and the second energy beam detector positioned on or proximate the build unit, proximate the second build unit corner, the additive manufacturing machine configured to determine a correction factor using the second energy beam and the first and second energy beam detectors, the method comprising:

calibrating the reflecting unit to create a grid, the grid comprising a plurality of data sets that correlate a plurality of reflector positions with a plurality of positions on the build unit and a first location of a first energy beam detector;

sintering a first layer of material using the first energy beam that travels, at least in part, along a common path to form a first sintered layer of an object;

targeting the first energy beam detector using the second energy beam that travels, at least in part, along the common path and measuring a first reflector position;

targeting the second energy beam detector using the second energy beam and measuring a second reflector position;

wherein the second energy beam is configured to target the first energy beam detector and the second energy beam detector to determine a difference between the first reflector position corresponding to the first location of the first energy beam detector and the second reflector position corresponding to a second location of the first energy beam detector;

comparing the first reflector position with the grid;

determining the correction factor as a function of the comparison between first reflector position and the grid;

applying the correction factor to the plurality of data sets in the grid;

sintering a second layer of material using the first energy beam according to the corrected grid to form a second sintered layer of the object.

9. The method of claim 8, wherein targeting the second energy beam detector occurs between targeting the first energy beam detector and comparing the first reflector position with the grid.

10. The method of claim 8, wherein comparing the first reflector position with the grid further comprises comparing the second reflector position with the grid to determine the correction factor.

11. The method of claim 8, wherein applying the correction factor to the grid comprises adding the correction factor to each of the plurality of reflector positions in the grid.

12. The method of claim 11, wherein applying the correction factor effectively translates the grid in order to recorrelate the plurality of reflector positions with the plurality of positions on the build unit and the first location of a first energy beam detector.

13. The method of claim 8, wherein the plurality of data sets also correlate the plurality of reflector positions with a second location of the second energy beam detector, wherein:

the method further comprises targeting the second energy beam detector using the second energy beam and measuring the second reflector position; and     applying the correction factor to the grid comprises generating a plurality of displacement values and adding each of the plurality of displacement values to a corresponding one of the plurality of reflector positions in the grid.

14. The method of claim 13, wherein applying the correction factor effectively translates the grid in order to recorrelate the plurality of reflector positions with the plurality of positions on the build unit, the first location of the first energy beam detector, and the second location of the second energy beam detector.

15. The method of claim 13, wherein applying the correction factor effectively rotates the grid in order to recorrelate the plurality of reflector positions with the plurality of positions on the build unit, the first location of the first energy beam detector, and the second location of the second energy beam detector.

16. The method of claim 13, wherein applying the correction factor effectively scales the grid in order to recorrelate the plurality of reflector positions with the plurality of positions on the build unit, the first location of the first energy beam detector, and the second location of the second energy beam detector.

17. The method of claim 16, further comprising:

tracking an amount of correction that the grid has undergone; and     generating an error message if the amount of correction exceeds a preset threshold.

\* \* \* \* \*